United States Patent
Lin

(10) Patent No.: US 7,769,121 B2
(45) Date of Patent: Aug. 3, 2010

(54) PHASE DETECTOR FOR DATA COMMUNICATIONS

(75) Inventor: Chia-Liang Lin, Union City, CA (US)

(73) Assignee: Realtek Semiconductor Corporation, Science-Based Industrial Park, Hsinchu (TW)

( * ) Notice: Subject to any disclaimer, the term of this patent is extended or adjusted under 35 U.S.C. 154(b) by 1189 days.

(21) Appl. No.: 11/315,029

(22) Filed: Dec. 22, 2005

(65) Prior Publication Data

US 2007/0147570 A1    Jun. 28, 2007

(51) Int. Cl.
*H04L 7/00* (2006.01)
*H04L 25/00* (2006.01)
*H04L 25/40* (2006.01)

(52) U.S. Cl. .................. 375/371; 375/226; 375/327; 375/373; 375/374; 375/375; 375/376; 327/2; 327/3; 327/7; 327/8; 327/10; 327/12; 327/156; 327/159; 455/260; 370/516; 386/68; 377/71

(58) Field of Classification Search ........... 375/371, 375/286, 373–376, 319, 226, 327; 327/2, 327/3, 7, 8, 10, 12, 156, 159; 455/260; 386/68; 370/516; 377/71; 713/327
See application file for complete search history.

(56) References Cited

U.S. PATENT DOCUMENTS

| | | | |
|---|---|---|---|
| 4,535,459 A | 8/1985 | Hogge, Jr. et al. | |
| 5,448,598 A * | 9/1995 | Yousefi et al. | 375/376 |
| 6,088,415 A | 7/2000 | Gaudet | |
| 6,222,895 B1 * | 4/2001 | Larsson | 375/376 |
| 6,411,145 B1 | 6/2002 | Kueng et al. | |
| 6,909,329 B2 * | 6/2005 | Jasa et al. | 331/1 A |
| 2004/0051592 A1 * | 3/2004 | Ho et al. | 331/17 |
| 2005/0078780 A1 | 4/2005 | Chou et al. | |
| 2006/0250192 A1 * | 11/2006 | Hsieh | 331/16 |
| 2006/0291551 A1 * | 12/2006 | Goth | 375/232 |

OTHER PUBLICATIONS

Ansgar Pottbacker, et al., "A Si Bipolar Phase and Frequency Detector IC for Clock Extraction Up to 8 Gb/s", IEEE Journal of Solid-State Circuits, Dec. 1992, pp. 1747-1751, vol. 27, No. 12.
David G. Messerschmitt, "Frequency Detectors for PLL Acquisition in Timing and Carrier Recovery", IEEE Transactions on Communications, Sep. 1979, pp. 1288-1295, vol. COM-27, No. 9.

* cited by examiner

*Primary Examiner*—Mohammad H Ghayour
*Assistant Examiner*—Sung Ahn
(74) *Attorney, Agent, or Firm*—Winston Hsu

(57) ABSTRACT

In one embodiment, a phase error signal generated by a phase detector is equalized to compensate for the distortion in the phase error signal due to finite circuit speeds. The equalization may be based on suppressing the low frequency components of the phase error signal. For example, the amplitude of the phase error signal may be reduced when the amplitude of the phase error signal is not changing.

12 Claims, 4 Drawing Sheets

PHASE DETECTOR FOR DATA COMMUNICATIONS

BACKGROUND OF THE INVENTION

1. Field of the Invention

The present invention relates generally to data communications, and more particularly but not exclusively to methods and apparatus for recovering an embedded clock and detecting data from a data stream.

2. Description of the Background Art

A typical data communications system comprises a transmitter, a communication media, and a receiver. Data may be modulated at the transmitter, transmitted over the communication media, and then demodulated at the receiver. Non-return to zero (NRZ) is an example modulation scheme used in digital data communications. In FIG. 1, an example waveform of an NRZ modulated signal is shown above its corresponding binary data representation. In an NRZ waveform, a logical 1 has a high voltage with a pulse width of T, and a logical 0 has a low voltage also with a pulse width of T. The pulse width T is the reciprocal of the data rate. An NRZ modulated signal has both clock and data information, and is thus not transmitted with a separate clock signal.

FIG. 2 schematically shows an example communications system employing NRZ modulation. The communications system of FIG. 2 includes a transmitter 210, a communication media 220, and a receiver 230. The transmitter 210 includes an encoder 212, such as an 8B10B encoder, for encoding input binary data to another binary data sequence. A digital to analog converter (DAC) 213 in the transmitter 210 converts the logical (i.e., digital) output of the encoder 212 to analog form. The analog voltage signal from DAC 213 is transmitted over the communication media 220 (e.g., transmission line) to the receiver 230 as a data stream. In the example of FIG. 2, the receiver 230 includes a receiver front-end module 232, a clock data recovery (CDR) module 236, and a decoder 238. The front-end module 232 amplifies the voltage signal received over the communication media 220 (i.e., the input signal to the receiver 230), and generates an output voltage signal V. The voltage signal V is input to the CDR module 236, which recovers the NRZ encoded data D and the clock CLK used by the transmitter 210 and embedded in the NRZ waveform. The decoder 238 generates an output binary data sequence by decoding the recovered data D.

FIG. 3 shows a schematic diagram of a conventional CDR module 300. The CDR module 300 is an example implementation of the CDR module 236 shown in FIG. 2. The CDR module 300 is a phase lock loop (PLL) that comprises a binary phase detector (BPD) 310, a loop filter (LF) 320, and a voltage-controlled oscillator (VCO) 330. The output of the VCO 330 is a recovered clock CLK that tracks the clock embedded in the voltage signal V, which is the input to the CDR module 300. The BPD 310 compares the phase difference between the reference clock embedded in the voltage signal V and the recovered clock CLK, and generates a phase error signal E. A subsequent loop filter (LF) 320 filters the phase error signal E and generates a control signal C. The control signal C controls the frequency, and therefore also the phase, of the VCO 330. For example, if the recovered clock CLK is too fast compared to the reference clock embedded in the voltage signal V, the BFD 310 will generate a negative pulse in the phase error signal E and cause the frequency of the VCO 330 to decrease; if the recovered clock CLK is too slow compared to the reference clock embedded in the voltage signal V, the BFD 310 will generate a positive pulse in the phase error signal E and cause the frequency of the VCO 330 to increase. The frequency of the VCO 330 is thus adjusted in a closed-loop manner so that the frequency (and therefore also the phase) of the recovered clock CLK will track the frequency (and therefore also the phase) of the reference clock embedded in the voltage signal V.

As in the case of any clocking signal, the recovered clock CLK has two edges: a rising edge and a falling edge. In one embodiment, the rising edge is used and referred to as the leading edge, while the falling edge is used and referred to as the trailing edge. In other embodiments, the falling edge is used and referred to as the leading edge, while the rising edge is used and referred to as the trailing edge. Choosing which edge of the clock to use as the leading or trailing edge is a matter of design choice.

The primary function of a PLL, such as the CDR module 300, is to adjust the frequency (and therefore also the phase) of a recovered clock CLK so that the leading edge of the recovered clock CLK is aligned with the middle of the NRZ data represented by the voltage signal V, while the trailing edge of the recovered clock CLK is aligned with the data transition. In the CDR module 300, the BPD 310 determines the relative timing relationship between the data transition and the trailing edge of the recovered clock CLK.

The BPD 310 comprises four data flip flops (DFF) 312a, 312b, 312c, and 312d, and a BPD logic 314. The DFF 312a samples the NRZ data represented by the voltage signal V using the leading edge of the recovered clock CLK, and generates the data D. The DFF 312c samples the transition of the NRZ data represented by the voltage signal V using the trailing edge of the recovered clock CLK, and generates the transition sample S. The data D is further sampled by the DFF 312b using the leading edge of the recovered clock CLK, resulting in data P, which is the data D of the previous clock cycle. The transition sample S is further sampled by the DFF 312d using the leading edge of the recovered clock CLK, resulting in sample Q, which is the same as sample S but synchronized with the leading edge of the recovered clock CLK. If there is no data transition, i.e. there are two consecutive 1's or 0's in the NRZ data, the transition sample S will be identical with both the data D and the data P and no timing information is revealed. If there is a data transition, i.e. (D==0 and P==1) or (D==1 and P==0), timing relationships can be determined by comparing the synchronized transition sample Q with the data D. If the transition sample is sided with the data before transition, i.e. Q==P, it indicates the transition is sampled too early. On the other hand, if the transition sample is sided with the data after transition, i.e. Q==D, it indicates the transition is sampled too late. The BPD logic 314, which receives the data D, the sample P, and the sample Q, performs the aforementioned analysis to generate the phase error signal E based on: (1) detecting whether there is a data transition by comparing the data D with its previous sample P, and (2) detecting which end of the transition the transition sample is sided with by comparing the sample Q with the data D or comparing the sample Q with the sample P when there is a data transition.

The phase error signal E generated by the BPD logic 314 is a ternary signal (i.e. it has three possible values: +1, 0, −1). There are three possibilities: (1) E=0, indicating timing error is unknown due to no data transition (this occurs when D==P); (2) E=+1, indicating the recovered clock is too late compared to the reference clock embedded in the NRZ data (this occurs when D≠P and D==Q); and (3) E=−1, indicating the recovered clock is too early compared to the reference clock embedded in the NRZ data (this occurs when D≠P and D≠Q). The phase error signal E is thus indicative of a phase relationship between the reference clock signal embedded in the NRZ data and the recovered clock CLK generated by CDR module 300.

Although workable, the CDR module 300 is susceptible to performance degradation due to limited circuit speeds, in particular when the NRZ data rate is very high. In other words, because electrical circuits do not have infinite speed, most circuits will have difficulty processing very high speed data streams. Ideally, the phase error signal E of the BPD logic 314 is a ternary signal consisting of many pulses, either positive or negative, that have the same magnitude but varying widths. FIG. 4 shows an ideal waveform of a phase error signal E (labeled as "Ideal E") compared to its practical (i.e. actual; labeled as "practical E") waveform as generated by the BPD logic 314. In FIG. 4, the ideal phase error signal E contains a positive pulse 410 of width T, a negative pulse 412 of width 2T, a negative pulse 414 of width T, a positive pulse 416 of width 3T, and a negative pulse 418 of width T. Ideally, the total area of each pulse should be proportional to its pulse width. Due to finite circuit speeds, each pulse in the practical phase error signal E, positive or negative, is distorted. In particular, the total area of each pulse in the practical phase error signal is still related, but no longer proportional, to its pulse width. For example, a practical pulse with a pulse width of T (e.g., pulses 420, 424, 428) has an area that is relatively small. A practical pulse with a pulse width of 2T (e.g., pulse 422) has an area that is more than two times larger than that of a practical pulse with a pulse width of T; a practical pulse with a pulse width of 3T (e.g., 426) has an area that is more than three times larger than that of a practical pulse with a pulse width of T, and so on. Therefore, as the pulse width of the phase error signal gets wider, the distortion due to finite circuit speeds becomes more significant. The distortion in phase error signal results in excessive clock jitters at VCO 330 output and degrades the system performance.

What is needed is a method to correct the distortion in phase error signal due to finite circuit speeds.

SUMMARY

In one embodiment, a phase error signal generated by a phase detector is equalized to compensate for the distortion in the phase error signal due to finite circuit speeds. The equalization may be based on suppressing the low frequency components of the phase error signal. For example, the amplitude of the phase error signal may be reduced when the amplitude of the phase error signal is not changing.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 5:
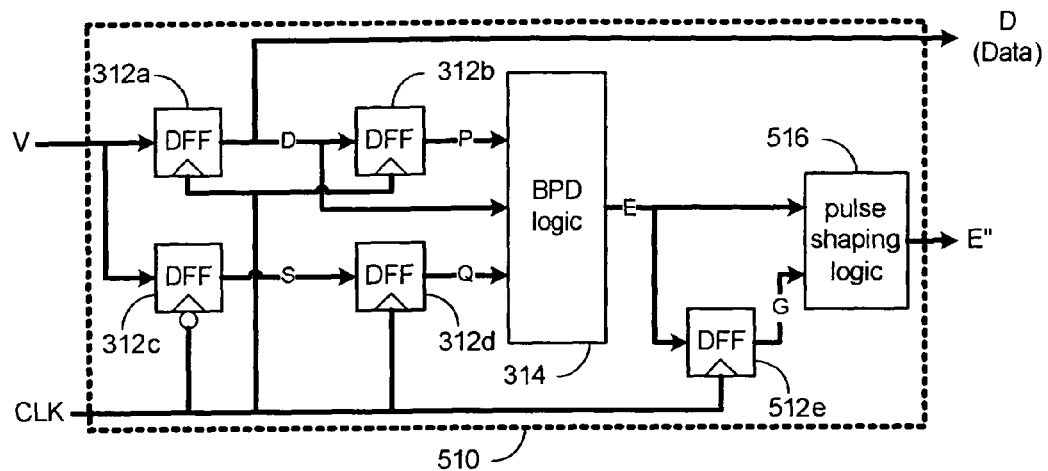
FIG. 5 shows a schematic diagram of a phase detector in accordance with an embodiment of the present invention.

FIG. 5 shows a schematic diagram of a phase detector 510 in accordance with an embodiment of the present invention. Phase detector 510 may be used in a clock data recovery (CDR) module, such as the CDR module 300 of FIG. 3. The phase detector 510 may also be used in other applications or with other circuits without detracting from the merits of the present invention.

Figure 1:
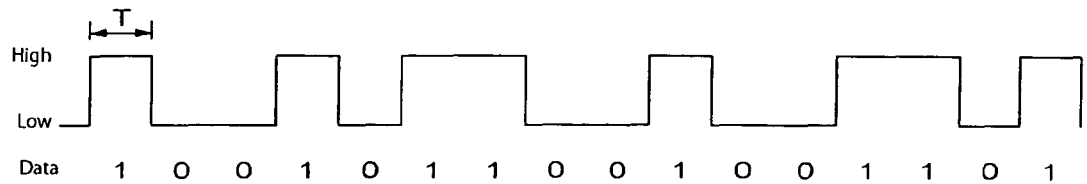
FIG. 1 shows a waveform of an example NRZ data stream.
Figure 2:
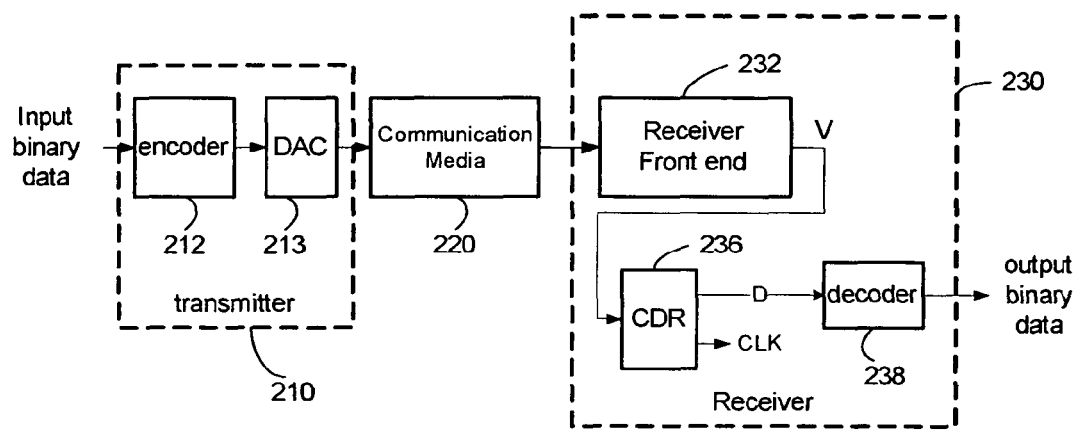
FIG. 2 schematically shows an example communications system employing NRZ modulation.
Figure 3:
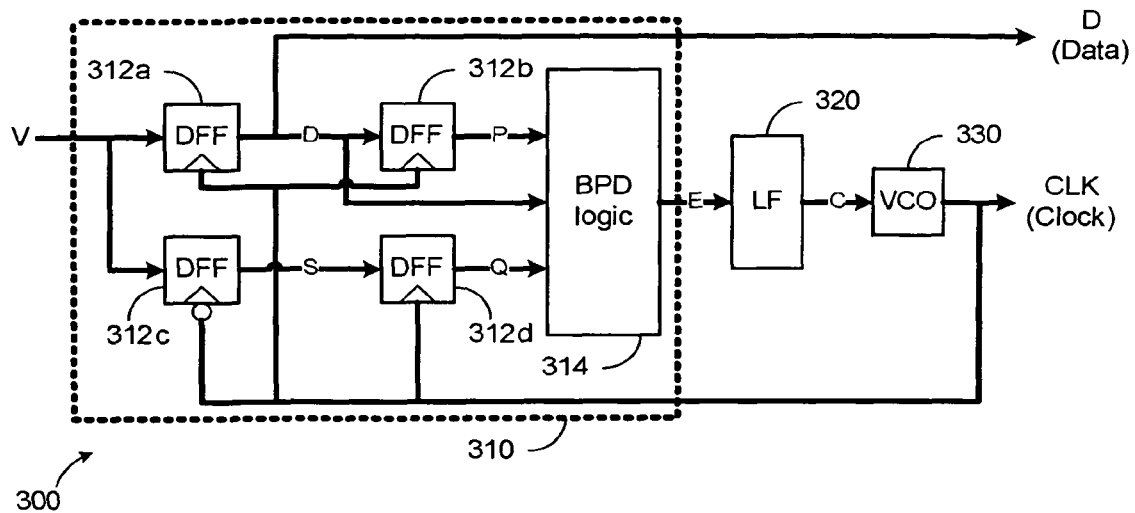
FIG. 3 shows a schematic diagram of a conventional clock data recovery module.

In one embodiment, the phase detector 510 is used in lieu of the phase detector 310 in the CDR module 300 of FIG. 3. Accordingly, the phase detector 510 may receive an input signal voltage V representing NRZ data and a recovered clock CLK from the VCO 330. The phase detector 510 outputs recovered data D and a refined phase error signal E". The phase error signal E" from the phase detector 510 may be filtered by the loop filter 320, which generates a control signal C that controls the frequency of the VCO 330 as previously described in connection with FIG. 3. As will be more apparent below, the refined phase error signal E" output of the phase detector 510 is a processed version of the phase error signal E output of the BPD logic 314.

In one embodiment, the phase detector 510 comprises the data flip flops (DFF) 312a, 312b, 312c, and 312d, the BPD logic 314, a DFF 512e, and a pulse shaping logic 516. DFF's 312a, 312b, 312c, and 312d and BPD logic 314 form a binary phase detector that is exactly the same as the BPD 310 of FIG. 3. The generation of signals D, P, S, and Q by DFF's 312a, 312b, 312c, and 312d, respectively, has already been discussed in connection with FIG. 3. The output and functionality of the BPD logic 314 in both phase detectors 310 and 510 are exactly the same.

Still referring to FIG. 5, the phase error signal E output of the BPD logic 314 is further sampled by the DFF 512e using the recovered clock CLK to generate the signal G. The signal G is thus the previous value of the phase error signal E stored in the DFF 512e. The current value of the phase error signal E output of BPD logic 314 and its previous value (i.e. the signal G) are processed by the pulse shaping logic 516 to generate the refined phase error signal E". In one embodiment, the pulse shaping logic 516 processes the phase error signal E output of the BPD logic 314 such that its peak amplitude, regardless of its pulse width, is equalized in the presence of finite circuit speeds.

Figure 6:
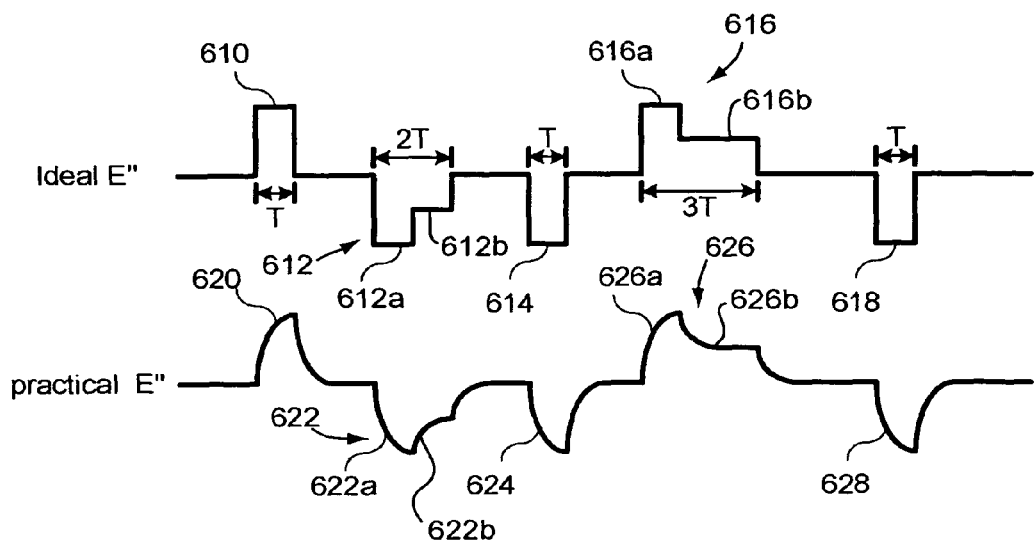
FIG. 6 shows example ideal and practical waveforms of the phase detector of FIG. 5.

FIG. 6 shows waveforms of an ideal phase error signal E" and the corresponding practical phase error signal E" actually generated by the pulse shaping logic 516. In one embodiment, the pulse shaping logic 516 processes the ternary phase error signal E and the ternary signal G to generate a multi-level phase error signal E". In one embodiment, the phase error signal E" has five possible values, namely +1, +½, 0, −½, or −1. A pulse having a value of +1 has a full positive high voltage, a pulse having a value of +½ has half of the full positive high voltage, a pulse having a value of 0 has zero voltage, a pulse having a value of −½ has half the full negative low voltage, and a pulse having a value of −1 has a full negative low voltage. In the example of FIG. 6, pulse 610 has a value of +1 and pulses 614 and 618 have a value of −1. Pulse 612 comprises portions 612a and 612b and pulse 616 comprises portions 616a and 616b. Portion 612a has a value of −1 while portion 612b has a value of −½. Similarly, portion 616a has a value of +1 while portion 616b has a value of +½.

Referring back to FIG. 5, a phase error signal E" value of 0 indicates that the timing error is unknown due to no data transition. This occurs when D==P. A positive phase error signal E" (i.e. value of +1 or +½) indicates that the recovered clock is too late, which occurs when D≠P and D==Q. A negative phase error signal E" (i.e. value of −1 and −½) indicates that the recovered clock is too early.

In one embodiment, the logical value of the phase error signal E" is reduced in half if there is a data transition in the NRZ data (i.e. when the phase error signal E output of the BPD logic 314 is not 0) and the phase error signal E output of the BPD logic 314 has not changed (i.e. when the phase error signal E is equal to the signal G). The just mentioned operation may be performed by the pulse shaping logic 516 using the example algorithm shown in Table 1. The algorithm of Table 1 is written in the C programming language for illustration purposes only. The variables E", E, and G refer to the signals shown in FIG. 5.

TABLE 1 if (E==0) E" = 0;
else if (E==G) E" = E/2;
else E" = E;

In the algorithm of Table 1, the amplitude of the phase error signal E" is half that of the phase error signal E if there is a transition in the NRZ data (i.e. the phase error signal E is not zero) and the value of the phase error signal E has not changed (i.e. the current and previous output values of the BPD logic 314 are the same). Otherwise, the value of the phase error signal E" is set to be the same as that of the phase error signal E. This advantageously prevents the tendency of generating a relatively large pulse for a wide pulse (i.e. pulse wider than 1T) in the presence of finite circuit speeds.

The pulse shaping logic 516 may employ the algorithm of Table 1 to generate the practical phase error signal E" waveform shown in FIG. 6. Note that in FIG. 6, the amplitude of ideal pulses with a pulse width of T (i.e. pulses 610, 614, and 618) still has a magnitude of 1. That is, in one embodiment, the pulse shaping logic 516 does not adjust the amplitude of pulses that have a pulse width of T. The pulse shaping logic 516 adjusts the amplitude of pulses having a pulse width wider than T (i.e., pulses 612 and 616) such that the amplitude is reduced by half after the pulse width exceeds T. The pulse shaping logic 516 then maintains the reduced amplitude until the end of the pulse. In effect, the pulse shaping logic 516 equalizes the phase error signal E output of the BPD logic 314 by enhancing its high frequency portions (e.g. pulses with a width of T), suppressing its low frequency portions (e.g. pulses with a width wider than T); or a combination of both. In the just-described embodiment, the suppression of low frequency components enhances the high frequency components in a relative sense.

Figure 4:
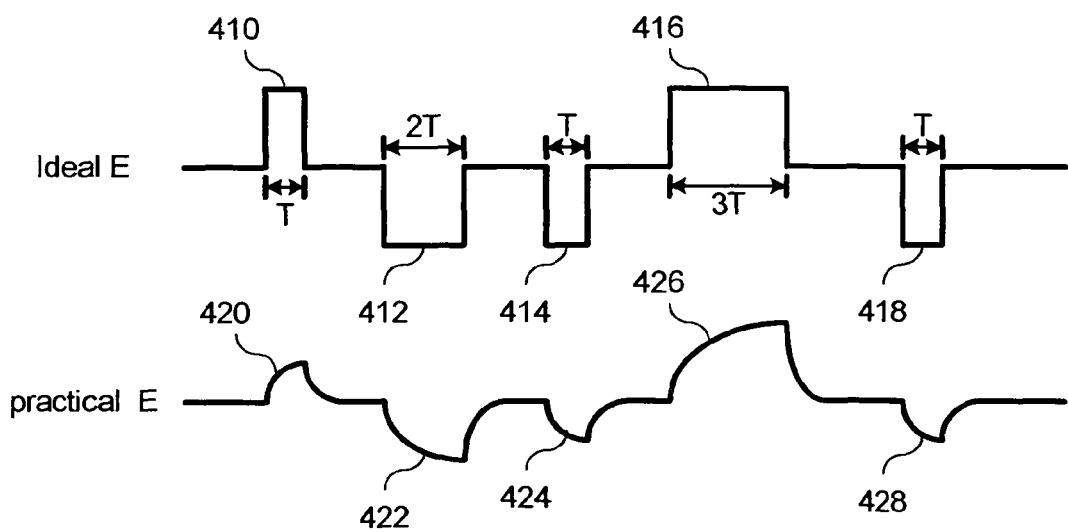
FIG. 4 shows example ideal and practical waveforms of a phase error signal generated by a phase detector in the clock data recovery module of FIG. 3.

Because electrical circuits have finite speeds, the actual waveform of the phase error signal E" will not exactly match its ideal waveform. In the example of FIG. 6, the lower waveform (practical E") shows how the phase error signal E" will actually look like when implemented using real world circuits. However, compared to the waveform of the practical E shown in FIG. 4, the pulses in the practical E" waveform of FIG. 6 have peak amplitudes that are roughly the same regardless of pulse width and the total area of each pulse is roughly proportional to its pulse width. This is what prior art circuits aim to achieve in the ideal case but fail in the practical case.

A five-level phase error signal E" output of the phase detector 510 may be represented by four binary signals U1, U2, D1, and D2 in a manner illustrated by the truth table of Table 2.

TABLE 2

| | E" | | | | |
|---|---|---|---|---|---|
| | +1 | +½ | 0 | −½ | −1 |
| U1 | 1 | 0 | 0 | 0 | 0 |
| U2 | 1 | 1 | 0 | 0 | 0 |
| D1 | 0 | 0 | 0 | 0 | 1 |
| D2 | 0 | 0 | 0 | 1 | 1 |

Figure 7:
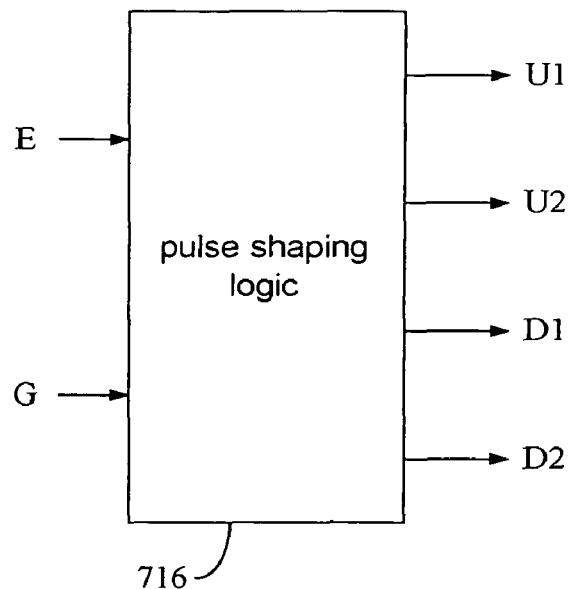
FIG. 7 shows a pulse shaping logic in accordance with an embodiment of the present invention.

A pulse shaping logic 716 that implements the truth table of Table 2 in accordance with an embodiment of the present invention is schematically shown in FIG. 7. The pulse shaping logic 716 may be used instead of the pulse shaping logic 516 in the phase detector 510 of FIG. 5. The pulse shaping logic 716 may take as inputs the phase error signal E output of the BPD logic 314 and the sample G output of the DFF 512e and output the binary signals U1, U2, D1, and D2. The binary signal outputs of the pulse shaping logic 716 may be decoded to generate the five level phase error signals +1, +½, 0, −½, and −1. For example, the phase error signal E" is a +1 when U1==1, U2==1, D1==0, and D2==0; the phase error signal E" is a +½ when U1==0, U2==1, D1==0, and D2==0; and so on. The pulse shaping logic 716 may utilize the algorithm of Table 1 and the truth table of Table 2 to generate the binary signals U1, U2, D1, and D2.

Each of binary signals U1 and U2 may be used to enable a positive pulse of certain unity magnitude. Each of binary signals D1 and D2 may be used to enable a negative pulse of certain unity magnitude. In one embodiment, a positive pulse is implemented by a current source of magnitude I/2, while a negative pulse is implemented by a current sink of magnitude I/2. The enabling of a current source or sink may be implemented by a switch controlled by one of the binary signals generated by the pulse shaping logic 716 to implement the truth table of Table 2.

Figure 8:
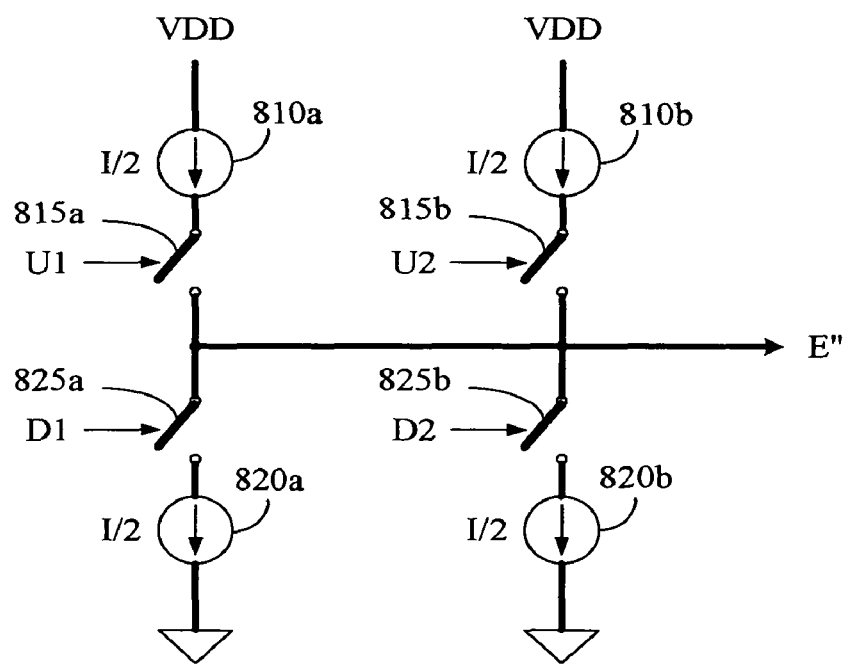
FIG. 8 shows a schematic diagram of an electrical circuit for generating a phase error signal in accordance with an embodiment of the present invention.

FIG. 8 shows a schematic diagram of an electrical circuit for generating the phase error signal E" given a set of binary signal inputs in accordance with an embodiment of the present invention. The circuit of FIG. 8 accepts the binary signals U1, U2, D1, and D2 from the pulse shaping logic 716 to output the phase error signal E". VDD denotes a power supply fed to the circuit. In the example of FIG. 8, current sources 810a and 810b each sources half of current I and are controlled by switches 815a and 815b, respectively. Current sinks 820a and 820b each sinks half of the current I and are controlled by switches 825a and 825b, respectively. The value of the current I depends on implementation. Switches 815a, 815b, 825a, and 825b may be controlled by the pulse shaping logic 716 using the binary signals U1, U2, D1, and D2, respectively, to generate the phase error signal E" in accordance with the truth table of Table 2.

As can be appreciated, the embodiments disclosed herein may be extended a variety of ways without detracting from the merits of the present invention. For example, the phase error signal E" may be made more refined by sampling more than one previous phase error signal E output of a binary phase detector and including the additional samples in the pulse shaping logic. For example, additional DFF's may be used to sample and store the phase error signal E output of the BPD logic 314 at different times, and using the samples in generating the phase error signal E".

The phase error signal E" may have values other than {+1, +½, 0, −½, −1}. For example, the phase error signal E" may have values of {+1, +¾, 0, −¾, −1} using the algorithm of Table 3.

TABLE 3 if (E==0) E" = 0;
else if (E==G) E" = ¾*F;
else E" = F;

In the algorithm of Table 3, which is written in the C programming language, a pulse shaping logic may reduce the logical value of the pulse amplitude by 25% if the current value of the phase error signal is the same as the previous value. This effectively prevents the tendency of generating a relatively large pulse for a wide pulse in the presence of finite circuit speeds. The percentage of reduction of the pulse amplitude when the pulse width exceeds T may depend on the speed of the phase detector circuit. If the circuit is relatively fast, the percentage of reduction should be chosen to be relatively small; if the circuit is relatively slow, the percentage of reduction should be relatively large. In this manner, the pulse shape of the phase error signal E is equalized to alleviate the detrimental effects of finite circuit speeds.

In the above described embodiments, the number of possible discrete levels of a phase error signal has been increased from three (ternary) to five. However, the phase error signal may have different number of levels other than five. For example, a multi-level phase error signal may be processed by a pulse shaping logic to generate a plurality of binary outputs, each of the binary outputs controlling a positive or negative pulse of a certain magnitude. For example, a phase error signal may have more than five different discrete values.

Although embodiments of the present invention have been disclosed in the context of binary phase detectors, those of ordinary skill in the art will appreciate that the principles taught herein can be applied to other type of phase detectors, such as linear phase detectors. Generally speaking, to compensate for the distortion of the phase error signal due to finite circuit speeds, the high frequency components (instances when the phase error signal changes rapidly) may be enhanced, the low frequency components (instances when the phase error does not change or change slowly) may be suppressed, or a combination of both.

Improved phase detectors have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A circuit for data communications, the circuit comprising:
a phase detector configured to receive an input data signal and a recovered clock signal and to generate a phase error signal comprising pulses having an amplitude indicative of a phase relationship between the recovered clock signal and a reference clock embedded in the input data signal;
a clock circuit configured to generate the recovered clock signal based on the phase error signal; and
a pulse shaping logic configured to adjust an amplitude of a pulse of the phase error signal to between the amplitude of the pulse of the phase error signal and zero based on a relationship between a value of the pulse of the phase error signal and a value of a pulse of a sample of the phase error signal;
wherein the pulse shaping logic comprises a first circuit configured to output a plurality of binary signals based on the phase error signal and the sample of the phase error signal, and a second circuit comprising a plurality of current sources and sinks, the current sources and sinks being controllable using the binary signals.

2. The circuit of claim 1 wherein the binary signals are coupled to switches to couple or decouple the current sources and sinks to a node presenting the phase error signal.

3. The circuit of claim 1 wherein the pulse shaping logic increases a number of possible levels of the phase error signal from three to five.

4. The circuit of claim 1 further comprising:
a flip flop configured to generate the sample of the phase error signal using the recovered clock signal.

5. The circuit of claim 1 further comprising:
a loop filter configured to filter the phase error signal; and
wherein the clock circuit comprises a controllable oscillator configured to generate the recovered clock signal based on the filtered phase error signal.

6. The circuit of claim 1 wherein the binary phase detector comprises:
a first flip flop configured to sample the input data signal using a leading edge of the recovered clock signal to generate a recovered data signal;
a second flip flop configured to sample the recovered data signal using the leading edge of the recovered clock signal to generate a sampled recovered data signal;
a third flip flop configured to sample the input data signal using a trailing edge of the recovered clock signal to generate a transition signal; and
a fourth flip flop configured to sample the transition signal using the leading edge of the recovered clock signal to generate a sampled transition signal.

7. The circuit of claim 6 further comprising:
a binary phase detection logic configured to generate the phase error signal based on the recovered data signal, the sampled recovered data signal, and the sampled transition signal.

8. The circuit of claim 1 wherein the input data signal comprises NRZ (non-return to zero) data.

9. A method of generating a phase error signal, the method comprising:
receiving a phase error signal comprising pulses, the phase error signal being indicative of a phase relationship between a reference clock embedded in an input data signal and a recovered clock signal generated based on the phase error signal;
sampling the phase error signal to generate a sampled phase error signal; and
adjusting an amplitude of a pulse of the phase error signal to between the amplitude of the pulse of the phase error signal and zero according to a width of the pulse of the phase error signal;
wherein the amplitude of the pulse is reduced after the width of the pulse exceeds T where T is a reciprocal of a data rate of the input data signal and wherein the adjusted amplitude of the pulse is maintained until the end of the pulse.

10. The method of claim 9 wherein the amplitude of the pulse is reduced by half.

11. The method of claim 9 wherein the recovered clock signal is generated by a controllable oscillator controlled using the phase error signal.

12. The method of claim 9 wherein the input data signal comprises NRZ (non-return to zero) data.

* * * * *